(12) United States Patent
Lee et al.

(10) Patent No.: US 9,698,374 B2
(45) Date of Patent: Jul. 4, 2017

(54) PRESSURE SENSITIVE ADHESIVE FILM

(71) Applicant: LG CHEM, LTD., Seoul (KR)

(72) Inventors: Hyun Sup Lee, Daejeon (KR); Yoon Gyung Cho, Daejeon (KR); Myung Han Lee, Daejeon (KR); Kyung Yul Bae, Daejeon (KR); Sang Eun Kim, Daejeon (KR); Sang Min Park, Daejeon (KR); Se Woo Yang, Daejeon (KR); Ye Hoon Im, Daejeon (KR)

(73) Assignee: LG CHEM, LTD., Seoul (KR)

( * ) Notice: Subject to any disclaimer, the term of this patent is extended or adjusted under 35 U.S.C. 154(b) by 50 days.

(21) Appl. No.: 14/939,857

(22) Filed: Nov. 12, 2015

(65) Prior Publication Data
US 2016/0130476 A1    May 12, 2016

(30) Foreign Application Priority Data

Nov. 12, 2014 (KR) .................. 10-2014-0157136
Nov. 12, 2014 (KR) .................. 10-2014-0157143
Nov. 12, 2014 (KR) .................. 10-2014-0157153

(51) Int. Cl.
| | |
|---|---|
| *H01L 51/52* | (2006.01) |
| *C09J 123/22* | (2006.01) |
| *C09J 145/00* | (2006.01) |
| *C09J 7/02* | (2006.01) |
| *C09J 4/06* | (2006.01) |
| *C08F 220/18* | (2006.01) |

(52) U.S. Cl.
CPC ............ *H01L 51/5253* (2013.01); *C09J 4/06* (2013.01); *C09J 7/0246* (2013.01); *C09J 123/22* (2013.01); *C09J 145/00* (2013.01); *C08F 220/18* (2013.01); *C09J 2201/622* (2013.01); *C09J 2203/326* (2013.01); *C09J 2205/114* (2013.01); *C09J 2409/00* (2013.01); *C09J 2423/00* (2013.01)

(58) Field of Classification Search
CPC ........ H01L 51/52; H01L 51/5253; C09J 4/06; C09J 7/0246; C09J 123/22
See application file for complete search history.

(56) References Cited

U.S. PATENT DOCUMENTS

| | | | |
|---|---|---|---|
| 8,232,350 B2 | 7/2012 | Fujita et al. | |
| 2012/0189829 A1* | 7/2012 | Jozuka | C09J 7/0246 428/216 |
| 2015/0079389 A1* | 3/2015 | Krawinkel | C09J 193/04 428/355 R |

(Continued)

FOREIGN PATENT DOCUMENTS

| | | |
|---|---|---|
| JP | 57-159864 A | 10/1982 |
| JP | 2011-526629 A | 10/2011 |
| JP | 2012-193335 A | 10/2012 |

*Primary Examiner* — Phuc Dang
(74) *Attorney, Agent, or Firm* — Dentons US LLP

(57) ABSTRACT

The present application provides a pressure-sensitive adhesive film, an organic electronic device including the same and a method of manufacturing an organic electronic device using the same. The present application provides the pressure-sensitive adhesive film which forms a structure effectively blocking water or oxygen from penetrating into an organic electronic device from the outside, and has excellent mechanical properties such as handleability, formability or the like and transparency.

19 Claims, 1 Drawing Sheet

(56) References Cited

U.S. PATENT DOCUMENTS

2015/0307754 A1\* 10/2015 Combs ................... A61K 47/38
                                                                                  428/354
2015/0364357 A1\* 12/2015 Takamoto ........... H01L 21/6836
                                                                                  257/778

\* cited by examiner

PRESSURE SENSITIVE ADHESIVE FILM

This application claims the benefit of Korean Patent Application No. 10-2014-0157136, filed Nov. 12, 2014, Korean Patent Application No. 10-2014-0157143, filed Nov. 12, 2014, and Korean Patent Application No. 10-2014-0157153, filed Nov. 12, 2014, all of which are hereby incorporated by reference in their entirety for all purposes as if fully set forth herein.

BACKGROUND

1. Field of the Invention

The present application relates to a pressure-sensitive adhesive film, an organic electronic device including the same and a method of manufacturing an organic electronic device using the same.

2. Discussion of Related Art

An organic electronic device (OED) denotes a device including an organic material layer for generating a flow of charges using holes and electrons, and examples thereof include a photovoltaic device, a rectifier, a transmitter, an organic light emitting diode (OLED), and so forth. Among the OEDs, an OLED has less power consumption and a higher response speed, and forms a thinner display device or lighting than a conventional light source. Further, the OLED has excellent space utilization, and is expected to be applied in a variety of fields including all various types of portable devices, monitors, notebook computers and TVs.

Organic materials and metal electrodes included in the OLED are too easily oxidized by external factors such as moisture, etc. Therefore, a product including the OLED is very sensitive to environmental factors. Accordingly, a variety of methods have been suggested to effectively prevent the penetration of oxygen or water from an external environment with respect to an OED such as the OLED, etc.

For example, Patent document 1 discloses an adhesive encapsulating composition film and organic electroluminescence device, in which the adhesive is based on polyisobutylene (PIB), but has poor formability and low reliability under high temperature and high humidity conditions.

Accordingly, there is a need for the development of an encapsulant which can ensure a lifespan required in an organic electronic device, effectively block the penetration of water, remain reliable under high temperature and high humidity conditions and has excellent optical properties.

[Prior Art]

[Patent Document]

(Patent document 1) Korean Laid-Open Patent Publication No. 2008-0088606

SUMMARY OF THE INVENTION

The present application provides a pressure-sensitive adhesive film which may form a structure effectively blocking water or oxygen from penetrating into an organic electronic device from the outside, and has excellent mechanical properties such as handleability, formability or the like and transparency, and provides an organic electronic device including the same and a method of manufacturing an organic electronic device using the same.

The present application relates to a pressure-sensitive adhesive film. The pressure-sensitive adhesive film may be applied for sealing or encapsulating the entire surface of an organic electronic device such as an OLED, etc.

In the present specification, the term "organic electronic device" denotes a product or device which has a structure including an organic material layer for generating a flow of charges using holes and electrons between a pair of electrodes opposite to each other, and examples thereof include a photovoltaic device, a rectifier, a transmitter, an organic light emitting diode (OLED), and so forth, but are not limited thereto. In an example of the present application, the organic electronic device may be an OLED.

A pressure-sensitive adhesive layer of an exemplary pressure-sensitive adhesive film may include a polymer derived from isobutylene. Further, the pressure-sensitive adhesive layer may satisfy the following Expression 4.

$$2.0 \times 10^5 \text{ Pa} \leq G_N^0 \leq 5.0 \times 10^5 \text{ Pa} \qquad \text{[Expression 4]}$$

where $G_N^0$ is a complex modulus value when a phase angle is a minimum in a graph (X-axis: complex modulus, Y-axis: phase angle) of a phase angle and complex modulus of a circular sample (diameter: 8 mm, thickness: 100 μm) prepared using the pressure-sensitive adhesive layer, which are measured using a discovery hybrid rheometer (DHR) while a frequency range is increased from 0.01 to 100 Hz at a temperature of 80° C. and a strain of 1%.

Specifically, a storage modulus and loss modulus may be measured according to the change in the frequency while the frequency in increased from 0.01 to 100 Hz after the sample is loaded. A phase angle according to Expression 1 and a complex modulus according to Expression 6 which will be described below may be calculated from the storage modulus and loss modulus (the phase angle calculated in Expression 1 and the complex modulus calculated in Expression 6 both are values at a frequency of 0.1 Hz, but here, the phase angle and complex modulus at a frequency in the range of 0.01 to 100 Hz are calculated), and the values of phase angle and complex modulus calculated according to the measurement result are plotted as a graph of the phase angle with respect to the complex modulus. In the plotted graph, the complex modulus at the minimum phase angle may be $G_N^0$, and $G_N^0$ denotes a plateau modulus.

The pressure-sensitive adhesive film in the above-described range of $G_N^0$ (plateau modulus) may form an excellent sealing or encapsulation structure which has no air bubbles under high temperature durability test conditions or the like, when applied in the sealing or encapsulation process.

An exemplary pressure-sensitive adhesive film may have a plateau modulus according to Expression 4 in the range of $2.0 \times 10^5$ to $5.0 \times 10^5$ Pa, $2.1 \times 10^5$ to $4.5 \times 10^5$ Pa or $2.2 \times 10^5$ to $4.0 \times 10^5$ Pa. When the compositions or crosslinking conditions of the pressure-sensitive adhesive film are adjusted as described below to have a plateau modulus in the above-described range, there may be provided the pressure-sensitive adhesive film which may realize a sealing or encapsulation structure having an excellent durability for an electronic device.

Further, the pressure-sensitive adhesive layer may have a phase angle (δ) in a range of 10° to 18° according to the following Expression 1:

$$\delta = \tan^{-1}(G''/G') \qquad \text{[Expression 1]}$$

where G' and G" respectively represent a storage modulus G' and loss modulus G" of the circular sample (diameter: 8 mm, thickness: 500 μm) prepared using the pressure-sensitive adhesive layer, which are measured using a discovery hybrid rheometer (DHR) under conditions of a temperature of 80° C., a strain of 1% and a frequency of 0.1 Hz. Specifically, a viscoelasticity (storage modulus and loss modulus) is measured according to the change in frequency while the frequency is increased from 0.01 to 100 Hz (at a temperature of 80° C. and a strain of 1%) after the sample is loaded on a stress control-type rheometer DHR2 manufactured by TA Instruments Inc., and the phase angle calculated by Expression 1 at 0.1 Hz may be calculated from the viscoelasticity.

As described above, the pressure-sensitive adhesive film may be applied for sealing or encapsulating the entire surface of an organic electronic device such as an OLED, etc. An existing isobutylene-based polymer has been suitable for an encapsulant due to low water permeability, but had a problem of poor reliability at high temperature and humidity because the polymer has low thermal resistance. According to the embodiment of the present application, moisture resistance and thermal resistance are enhanced by realizing a film including a polymer derived from isobutylene but satisfying the plateau modulus according to Expression 4. That is, the pressure-sensitive adhesive film in the above-described range of the phase angle (δ) may form an excellent sealing or encapsulation structure which has no air bubbles under high temperature durability test conditions or the like, when applied in the sealing or encapsulation process. In the embodiment of the present application, the pressure-sensitive adhesive film may be used to form a sealing or encapsulation structure for covering the top surface and side surface of the element of the organic electronic device as described below.

The term "discovery hybrid rheometer (DHR)" used herein denotes a measuring device of rheological properties, which evaluates viscoelastic properties such as viscosity, shear modulus, loss factor, phase angle, modulus of elasticity, etc. A stress control-type rheometer DHR2 manufactured by TA Instruments Inc. may be used as the above-described device in the present application.

An exemplary pressure-sensitive adhesive film may have a phase angle according to Expression 1 in the range of 10° to 18°, 11° to 17°, 12° to 16° or 13° to 16°. When the compositions or crosslinking conditions of the pressure-sensitive adhesive film are adjusted as described below to have a phase angle in the above-described range, there may be provided the pressure-sensitive adhesive film which may realize a sealing or encapsulation structure having an excellent durability for an electronic device.

In an example, the pressure-sensitive adhesive layer of the present application may have a complex viscosity ($\eta^* = |G^*|/\omega$) of $2.5 \times 10^4$ Pa·s to $5.0 \times 10^4$ Pa·s according to the following Expression 2.

$$\eta^* = |G^*|/\omega = \sqrt{(G'/\omega)^2 + (G''/\omega)^2}$$ [Expression 2]

where ω represents a frequency. The complex viscosity is measured at 1 Hz as described below, and thus w is 6.28 rad/s in Expression 2. In Expression 2, G' and G" respectively represent a storage modulus G' and loss modulus G" of the circular sample (diameter: 8 mm, thickness: 500 μm) prepared using the pressure-sensitive adhesive layer, which are measured using a discovery hybrid rheometer (DHR) under conditions of a temperature of 80° C., a strain of 1% and a frequency of 0.1 Hz. Specifically, a viscoelasticity (storage modulus and loss modulus) is measured according to the change in frequency while the frequency is increased from 0.01 to 100 Hz (at a temperature of 80° C. and a strain of 1%) after the sample is loaded on a stress control type rheometer DHR2 manufactured by TA Instruments Inc., and the complex viscosity calculated by Expression 2 at 1 Hz (1 Hz=2π rad/s) is calculated from the viscoelasticity. The complex viscosity may be in the range of $2.5 \times 10^4$ to $5.0 \times 10^4$ Pa·s, $2.6 \times 10^4$ to $4.5 \times 10^4$ Pa·s or $2.7 \times 10^4$ to $4.3 \times 10^4$ Pa·s. In an example, the pressure-sensitive adhesive film having the complex viscosity in the above-described range may have excellent water blocking properties, and reliability and optical properties at high temperature and humidity.

In an example, the pressure-sensitive adhesive layer may have a recovery rate $R_1$ of 55% or more according to the following Expression 3.

$$R_1 = (S_M - S_{R,30}) \times 100/S_M$$ [Expression 3]

Expression 3, $S_M$ is a maximum strain (%) of the circular sample (diameter: 8 mm, thickness: 500 μm) prepared using the pressure-sensitive adhesive layer, measured using a discovery hybrid rheometer (DHR) when a strain is applied at a shear stress of 2,000 Pa and a temperature of 80° C. for 3 minutes, and $S_{R,30}$ is a residual strain (%) measured 30 seconds after the stress is removed. Here, the strain is a strain caused by shear stress. Specifically, a strain is continuously measured while a strain is applied at a shear stress of 2,000 Pa for 3 minutes after the circular sample is loaded on a stress control type rheometer DHR2 manufactured by TA Instruments Inc., and the maximum strain is measured from the measured strain. For example, when a strain is applied for 3 minutes, a strain when the time reaches 3 minutes may be the maximum strain. Further, the stress may be removed at 3 minutes, and a residual strain may be obtained by measuring a strain 30 seconds after the stress is removed.

The pressure-sensitive adhesive film having the recovery rate $R_1$ in the above-described range may form an excellent sealing or encapsulation structure which has no air bubbles under high temperature durability test conditions or the like, when applied in the sealing or encapsulation process.

A pressure-sensitive adhesive layer of an exemplary pressure-sensitive adhesive film may have a recovery rate $R_1$ according to Expression 3 of 55% or more, 60% or more, or 65% or more. The upper limit of the recovery rate is not particularly limited, and may be 100% or 99%. When the compositions or crosslinking conditions of the pressure-sensitive adhesive film are adjusted as described below to have a recovery rate in the above-described range, there may be provided the pressure-sensitive adhesive film which may realize a sealing or encapsulation structure having an excellent durability for an electronic device.

Further, in an example, the pressure-sensitive adhesive layer of the present application may have a recovery rate $R_2$ according to Expression 5 of 85% or more.

$$R_2 = (S_M - S_{R,600}) \times 100/S_M$$ [Expression 5]

In Expression 5, $S_M$ is a maximum strain (%) of the circular sample (diameter: 8 mm, thickness: 500 μm) prepared using the pressure-sensitive adhesive layer, measured using a discovery hybrid rheometer (DHR) when a stress is applied at a shear stress of 2,000 Pa and a temperature of 80° C. for 3 minutes, and $S_{R,600}$ is a residual strain (%) measured 600 seconds after the stress is removed. The detailed measurement method is as described above. In an example, the recovery rate $R_2$ may be 85% or more, 90% or more, or 93% or more. The upper limit of the recovery rate is not particularly limited, and may be 100% or 99%. Further, in an example, the maximum strain $S_M$ may be 7% or less, 6% or less, or 5% or less, and the lower limit may be 1%. In an example, the pressure-sensitive adhesive film having the recovery rate in the above-described range may have excellent water blocking properties, and reliability and optical properties at high temperature and humidity.

Further, in an example, the pressure-sensitive adhesive layer may have a complex modulus |G*| according to Expression 6 in the range of $1.5 \times 10^4$ to $4.0 \times 10^4$ Pa, $1.6 \times 10^4$ to $3.5 \times 10^4$ Pa, $1.7 \times 10^4$ to $3.0 \times 10^4$ Pa or $1.8 \times 10^4$ to $2.8 \times 10^4$ Pa.

$$|G^*|=\sqrt{(G')^2+(G'')^2} \quad \text{[Expression 6]}$$

In an example, the pressure-sensitive adhesive film having the plateau modulus, phase angle or complex modulus in the above-described ranges may have excellent water blocking properties, and reliability and optical properties at high temperature and humidity.

In a specific example of the present application, the pressure-sensitive adhesive layer may have a cross-linked molecular weight according to Expression 7 in the range of 5,000 to 10,000 g/mol. Further, the pressure-sensitive adhesive layer may have a crosslinking density according to Expression 8 in the range of $8.0 \times 10^{-5}$ to $2.0 \times 10^{-4}$ mol/cm$^3$.

$$Mc=4\rho RT/5 \; G_N^0 \quad \text{[Expression 7]}$$

where, Mc represents a cross-linked molecular weight, $\rho$ represents the density of the pressure-sensitive adhesive layer, R is 8.314 J/molK as a gas constant, T represents a temperature, and $G_N^0$ represents a plateau modulus.

$$\upsilon=\rho/Mc \quad \text{[Expression 8]}$$

where, $\upsilon$ represents a crosslinking density, $\rho$ represents the density of the pressure-sensitive adhesive layer, and Mc represents a cross-linked molecular weight.

A cross-linked molecular weight or crosslinking density may be adjusted as described above so as to satisfy the aforementioned physical properties of the expressions, and thereby the pressure-sensitive adhesive film having a desired reliability, thermal resistance, moisture resistance or the like at high temperature and humidity in the present application may be realized when the a cross-linked molecular weight and crosslinking density are in the aforementioned ranges.

Moreover, the pressure-sensitive adhesive film according to the embodiment of the present application may have a water vapor transmission rate of 50 g/m$^2$·day or less, 40 g/m$^2$·day or less, 30 g/m$^2$·day or less, 20 g/m$^2$·day or less, or 10 g/m$^2$·day or less at 100° F. and a relative humidity of 100%, the water vapor transmission rate being measured in the thickness direction of the pressure-sensitive adhesive layer in a state in which the pressure-sensitive adhesive layer is prepared with a thickness of 100 μm. When the compositions or crosslinking conditions of the pressure-sensitive adhesive are adjusted to have water vapor transmission rate in this range, there may be provided a sealing or encapsulation structure which may stably protect an element by effectively blocking the penetration of water, oxygen or the like when the pressure-sensitive adhesive is applied in the sealing or encapsulation structure of the electronic device. The lower the water vapor transmission rate is, the more excellent the water blocking properties are, and thus the lower limit of the water vapor transmission rate is not particularly limited, but for example, may be 0 g/m$^2$·day.

In the present application, the pressure-sensitive adhesive film may include a pressure-sensitive adhesive, and the pressure-sensitive adhesive may be formed as a layer. Accordingly, the term "pressure-sensitive adhesive layer" used herein may have the same meaning as the pressure-sensitive adhesive or pressure-sensitive adhesive film. Materials forming the pressure-sensitive adhesive layer are not particularly limited insofar as the materials satisfy any one of the expressions, and may be suitably selected by those skilled in the art in the range as long as any one of the expressions are satisfied. For example, the pressure-sensitive adhesive layer of the pressure-sensitive adhesive film may include a polymer derived from isobutylene and an active energy ray-polymerizable compound which is polyfunctional and may be polymerized by an active energy ray irradiation ray so as to satisfy the physical properties as described above.

In a specific example of the present application, the polymer may have a glass transition temperature of less than 0° C., −10° C., −30° C., −50° C. or −60° C. The glass transition temperature may denote a glass transition temperature measured after radiating ultraviolet rays having an intensity of about 1 J/cm$^2$ or more, or a glass transition temperature measured after additional heat curing after the ultraviolet ray irradiation.

The term "polymer derived from isobutylene" used herein denotes that a polymerization unit of a specific polymer includes isobutylene.

In a specific example, the polymer derived from isobutylene may be used as a polymer of the pressure-sensitive adhesive film formed of the pressure-sensitive adhesive composition. The polymer derived from isobutylene has low polarity, is transparent and resistant to corrosion, and thus may realize excellent water blocking properties, reliability of durability, and optical properties.

The polymer derived from isobutylene may be a homopolymer of an isobutylene monomer; a copolymer prepared by polymerizing an isobutylene monomer and other polymerizable monomers; or a mixture thereof in the present application. The derived polymer denotes that a monomer forms a polymer as a polymerized unit.

In an example, the polymer may be a copolymer of a diene and an olefin-based compound including one carbon-carbon double bond. Here, the olefin-based compound may include isobutylene, propylene, ethylene or the like, and the diene may include a monomer polymerizable with the olefin-based compound, such as 1-butene, 2-butene, isoprene, butadiene, etc.

In an example, the polymer may include polyisobutylene, a copolymer of isobutylene and isoprene, a copolymer of isoprene and styrene, a copolymer of butadiene and styrene, a copolymer of isoprene, butadiene and styrene, a copolymer of polyisoprene, polybutadiene, or isoprene and styrene, a copolymer of butadiene and styrene, or a copolymer of isoprene, butadiene and styrene.

In an example, the polymer may include a copolymer having a polymerization unit of the following Formula A and a polymerization unit of the following Formula B:

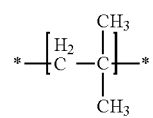

[Formula A]

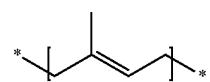

[Formula B]

In the above description, the copolymer may include a polymerization unit of Formula A at 95 to 99.5 mol % or 97 to 99 mol % and a polymerization unit of Formula B at 0.5 to 5 mol % or 1 to 3 mol %. In the formulas, * represents a binding site for connection of each polymerization unit in the copolymer. In the above description, the monomer of Formula A may be isobutylene, the monomer of Formula B may be isoprene, and the copolymer may be butyl rubber.

The polymer or an elastomer component in the pressure-sensitive adhesive composition may have a weight-average molecular weight (Mw) at which molding the pressure-sensitive adhesive composition in the form of a film is possible. For example, the polymer or the elastomer component may have a weight-average molecular weight of about 100 thousand to 2 million, 100 thousand to 1.5 million, or 100 thousand to 1 million. The term "weight-average molecular weight" used herein refers to a conversion value of a standard polystyrene measured using gel permeation chromatography (GPC). However, the polymer or elastomer component does not necessarily have the aforementioned weight-average molecular weight. For example, when a molecular weight of the polymer or elastomer component does not reach a level at which the film may be formed, a separate binder resin may be mixed with the pressure-sensitive adhesive composition.

Further, the pressure-sensitive adhesive composition of the present application may include an active energy ray-polymerizable compound which has a high compatibility with the polymer derived from isobutylene, and may form a specific cross-linked structure with the polymer.

For example, the pressure-sensitive adhesive composition of the present application may include a polymer derived from isobutylene and an active energy ray-polymerizable compound which is polyfunctional and may be polymerized by active energy ray irradiation. The active energy ray-polymerizable compound may refer to a compound including at least two of, for example, functional groups which may participate in the polymerization reaction by irradiation of the active energy ray such as a functional group including an ethylenically unsaturated double bond such as an acryloyl group, a methacryloyl group or the like, and a functional group such as an epoxy group, an oxetane group, etc.

For example, a multifunctional acrylate (MFA) may be used as the active energy ray-polymerizable compound which is polyfunctional.

Moreover, the active energy ray-polymerizable compound which is polyfunctional and may be polymerized by active energy ray irradiation may satisfy the following Formula 1. Furthermore, the active energy ray-polymerizable compound may be included at 5 to 30 parts by weight, 5 to 25 parts by weight, 8 to 20 parts by weight, 10 to 18 parts by weight, or 12 to 18 parts by weight relative to 100 parts by weight of the polymer derived from isobutylene.

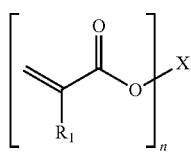

[Formula 1]

where $R_1$ is hydrogen or an alkyl group having 1 to 4 carbon atoms, n is an integer of 2 or more, X represents an n-valent residue derived from a linear, branched or cyclic alkyl group having 3 to 30 carbon atoms. In the above description, when X is a residue derived from a cyclic alkyl group, X may be a residue derived from a cyclic alkyl group having 3 to 30 carbon atoms, 6 to 28 carbon atoms, 8 to 22 carbon atoms, or 12 to 20 carbon atoms. Further, when X is a residue derived from a linear alkyl group, X may be a residue derived from a linear alkyl group having 3 to 30 carbon atoms, 6 to 25 carbon atoms, or 8 to 20 carbon atoms. Moreover, when X is a residue derived from a branched alkyl group, X may be a residue derived from a branched alkyl group having 3 to 30 carbon atoms, 5 to 25 carbon atoms, or 6 to 20 carbon atoms.

The term "polymer derived from isobutylene" used herein may refer to a residue of a specific compound, consisting of an alkyl group. In an example, in Formula 1, when n is 2, X may be an alkylene group. Furthermore, when n is 3, at least two hydrogen atoms of the alkyl group of X may be desorbed and bound to a (meth)acroyl group of Formula 1.

The term "alkyl group" used herein, unless otherwise defined, may denote an alkyl group having 1 to 30 carbon atoms, 1 to 25 carbon atoms, 1 to 20 carbon atoms, 1 to 16 carbon atoms, 1 to 12 carbon atoms, 1 to 8 carbon atoms, or 1 to 4 carbon atoms. The alkyl group may have a straight chain, branched chain, or ring structure. Further, the alkyl group may be arbitrarily substituted with one or more substituents.

The term "alkylene group" used herein, unless otherwise defined, may denote an alkylene group having 2 to 30 carbon atoms, 2 to 25 carbon atoms, 2 to 20 carbon atoms, 2 to 16 carbon atoms, 2 to 12 carbon atoms, 2 to 10 carbon atoms, or 2 to 8 carbon atoms. The alkylene group may have a straight chain, branched chain, or ring structure. Further, the alkylene group may be arbitrarily substituted with one or more substituents.

The term "alkoxy group" used herein, unless otherwise defined, may denote an alkoxy group having 1 to 20 carbon atoms, 1 to 16 carbon atoms, 1 to 12 carbon atoms, 1 to 8 carbon atoms, or 1 to 4 carbon atoms. The alkoxy group may have a straight chain, branched chain, or ring structure. Further, the alkoxy group may be arbitrarily substituted with one or more substituents.

The active energy ray-polymerizable compound which is polyfunctional and may be polymerized by active energy ray irradiation is not limited insofar as the compound satisfies Formula 1. For example, the compound may include 1,4-butanediol di(meth)acrylate, 1,3-butylene glycol di(meth)acrylate, 1,6-hexanediol di(meth)acrylate, 1,8-octanediol di(meth)acrylate acrylate, 1,12-dodecanediol di(meth)acrylate, neopentylglycol di(meth)acrylate, dicyclopentanyl di(meth)acrylate, cyclohexane-1,4-dimethanol di(meth)acrylate, tricyclodecane dimethanol di(meth)acrylate, dimethylol dicyclohexyl pentane di(meth)acrylate, neopentyl glycol-modified trimethylol propane di(meth)acrylate, adamantane di(meth)acrylate, trimethylolpropane tri(meth)acrylate or a mixture thereof.

For example, the compound having a molecular weight of less than 1,000 and two or more functional groups may be used as the active energy ray-polymerizable compound which is polyfunctional. Here, the molecular weight may refer to a weight average molecular weight or conventional molecular weight. A ring structure in the active energy ray-polymerizable compound which is polyfunctional may be any one of a carbocyclic structure or heterocyclic structure; or a monocyclic or polycyclic structure.

Furthermore, in a specific example of the present application, the pressure-sensitive adhesive composition may further include a silane compound satisfying the following Formula 2.

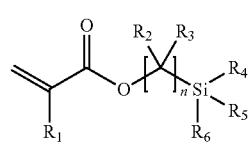

[Formula 2]

where $R_1$ is hydrogen or an alkyl group. For example, $R_1$ may be an alkyl group having 1 to 4 carbon atoms, or 1 to 2 carbon atoms. Moreover, $R_2$ and $R_3$ each may independently represent hydrogen or a linear, branched or cyclic alkyl group, or $R_2$ and $R_3$ may be connected to each other to form a cyclic alkyl group. For example, $R_2$ and $R_3$ each may independently represent hydrogen or a linear, branched or cyclic alkyl group. The linear alkyl group may have 1 to 10, 1 to 6 or 1 to 4 carbon atoms, the branched alkyl group may have 3 to 10, 3 to 6 or 3 to 4 carbon atoms, and the cyclic alkyl group may have 3 to 10, 3 to 8, 3 to 6 or 3 to 4 carbon atoms. Further, $R_2$ and $R_3$ may be connected to each other to form a cyclic alkyl group having 2 to 10, 3 to 10, 4 to 9 or 4 to 8 carbon atoms. Moreover, $R_4$, $R_5$ and $R_6$ each may independently represent hydrogen, an alkyl group or alkoxy group, at least one of $R_4$, $R_5$ and $R_6$ represents an alkoxy group, and n represents an integer of 1 or more in Formula 1. Specifically, $R_4$, $R_5$ and $R_6$ each may independently represent an alkyl group having 1 to 10, 1 to 6, 1 to 4 or 1 to 2 carbon atoms; or an alkoxy group having 1 to 10, 1 to 8, 1 to 4 or 1 to 2 carbon atoms. At least one of $R_4$, $R_5$ and $R_6$ may be an alkoxy group or all of $R_4$, $R_5$ and $R_6$ may be an alkoxy group, but the present application is not limited thereto.

In an example, the silane compound is not particularly limited insofar as the compound satisfies Formula 2, but may be 3-methacryloxypropyl trimethoxysilane, 3-methacryloxypropyl triethoxysilane, 3-acryloxypropyl trimethoxysilane, 3-acryloxypropyl triethoxysilane, 3-methacryloxymethyl triethoxysilane, 3-methacryloxymethyl trimethoxysilane, 3-acryloxypropyl methyldimethoxysilane, methacryloxymethyl methyl dimethoxysilane, methacryloxymethyl methyl diethoxysilane, methacryloxypropyl methyl dimethoxysilane, methacryloxypropyl methyl diethoxysilane, methacryloxypropyl dimethylmethoxysilane or methacryloxypropyl dimethylethoxysilane. The acryl group of the silane compound may serve to increase interfacial adhesion by crosslinking with the polymer of the pressure-sensitive adhesive composition or active energy ray-polymerizable compound, and ensure high-temperature and high-humidity reliability. For example, the silane compound may be included at 0.1 to 10 parts by weight, 0.5 to 8 parts by weight, 0.8 to 5 parts by weight, 1 to 5 parts by weight, 1 to 4.5 parts by weight, or 1 to 4 parts by weight relative to 100 parts by weight of the polymer derived from isobutylene.

In an example, the active energy ray-polymerizable compound may form a cross-linked structure with the silane compound satisfying Formula 2, and the crosslinking structure may form a semi-interpenetrating polymer network with the polymer derived from isobutylene. That is, the pressure-sensitive adhesive composition may include a semi-interpenetrating polymer network (hereinafter, referred to as a "semi-IPN"). The term "semi-IPN" used herein includes at least one polymer network and at least one straight or branched polymer, and at least a portion of the linear or branched polymer penetrates the polymer network. A semi-IPN may be distinguished from the structure of IPN in terms that the straight or branched polymer may be theoretically separated from the polymer network without affecting chemical bonds.

In a specific example, the cross-linked structure may be a cross-linked structure formed by applying heat, a cross-linked structure formed by active energy-ray irradiation, or a cross-linked structure formed by aging at room temperature. Here, the category of "active energy ray" may include microwaves, IR rays, UV rays, X rays, gamma ($\gamma$) rays, or particle beams such as alpha ($\alpha$)-particle beams, proton beams, neutron beams or electron beams, may generally be an UV ray, electron beam, etc. When the semi-IPN structure as described above is introduced, mechanical properties such as formability of the pressure-sensitive adhesive composition may be improved, a humidity-resistant adhesive performance may be enhanced, and transparency may be obtained, and thus realizing high water blocking properties and a long lifespan of the panel, which have never been attained.

In an example, the active energy ray-polymerizable compound may form a cross-linked structure with the silane compound satisfying Formula 2, and the polymer may form a cross-linked structure with the active energy ray-polymerizable compound or the silane compound satisfying Formula 2 to form an interpenetrating polymer network (hereinafter, referred to as an "IPN") structure. Further, the term "IPN structure" used herein refers to a state in which at least two cross-linked structures are present in the pressure-sensitive adhesive. In an example, the IPN structure may refer to a structure including at least two cross-linked structures in an intertwined, entangled, and interpenetrating state. For example, the composition according to the embodiment of the present application may include a cross-linked structure of the polymer (hereinafter, may be referred to as a "first cross-linked structure"), a cross-linked structure formed by a reaction between the active energy ray-polymerizable compound and the silane compound satisfying Formula 2 (hereinafter, may be referred to as a "second cross-linked structure"). These first and second cross-linked structures may be present in an interpenetrating or intertangled state. When the cross-linked pressure-sensitive adhesive composition includes the semi-IPN or IPN structure, the adhesion of the pressure-sensitive adhesive at high temperature and humidity may be increased, and water blocking properties and thermal resistance may be enhanced.

In a specific example of the present application, the pressure-sensitive adhesive composition may include a radical initiator to induce a polymerization reaction of the active energy ray-polymerizable compound. The radical initiator may be a photoinitiator or a thermal initiator. A specific type of the photoinitiator may be suitably selected in consideration of a cure rate, possibility of yellowing, etc. For example, a benzoin-based, hydroxy-ketone-based, amino-ketone-based, or phosphine-oxide-based photoinitiator may be used. Specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenyl-acetophenone, 2,2-diethoxy-2-phenylacetophenone, 2-hydroxy-2-methyl-1-phenylpropan-1-one, 1-hydroxycyclohexylphenylketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenyl benzophenone, 4,4'-diethylamino-benzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenonedimethylketal, p-dimethylaminobenzoateester, oligo [2-hydroxy-2-methyl-1-[4-(1-methylvinyl) phenyl]propanone], 2,4,6-trimethylbenzoyl-diphenylphosphine oxide, and the like may be used.

The radical initiator may be included at 0.2 to 20 parts by weight, 7 to 15 parts by weight, 8 to 14 parts by weight, or 10 to 13 parts by weight relative to 100 parts by weight of the active energy ray-polymerizable compound. In an example, the radical initiator is preferably included at 7 parts by weight or more to realize the degree of crosslinking in a suitable range. Accordingly, the reaction of the active energy ray-polymerizable compound may be effectively induced, and deterioration of the physical properties of the pressure-sensitive adhesive composition due to the remaining components after curing may be prevented.

In an example, the pressure-sensitive adhesive composition may further include a tackifier, and the tackifier may be preferably a hydrogenated cyclic olefin-based polymer. An example of the tackifier may include a hydrogenated petroleum resin obtained by hydrogenating a petroleum resin. The hydrogenated petroleum resin may be partially or fully hydrogenated, or may be a mixture of the partially and fully hydrogenated petroleum resins. As the tackifier, a tackifier having good compatibility with pressure-sensitive adhesive composition and excellent water barrier properties may be selected. Specific examples of the hydrogenated petroleum resin may include a hydrogenated terpene-based resin, a hydrogenated ester-based resin, a hydrogenated dicyclopentadiene-based resin, etc. The tackifier may have a weight-average molecular weight of about 200 to 5,000. A content of the tackifier may be suitably adjusted as necessary. For example, the content of the tackifier may be selected in consideration of a gel content or the like which will be described below, and the tackifier may be included at 5 to 100 parts by weight, 8 to 95 parts by weight, 10 to 93 parts by weight, or 15 to 90 parts by weight relative to 100 parts by weight of the solid content of the pressure-sensitive adhesive composition.

The pressure-sensitive adhesive composition may further include a moisture absorbent as necessary. The term "moisture absorbent" used herein may refer to, for example, a material that may absorb water by a chemical reaction with either water or moisture that has penetrated into the pressure-sensitive adhesive film which will be described below. When the pressure-sensitive adhesive composition of the present application includes the moisture absorbent, although light transmittance as described below may be not satisfied when the composition is formed as a film, excellent water blocking properties may be realized. Specifically, the pressure-sensitive adhesive composition may be applied to encapsulate an organic electronic device when being formed as a film. Here, the pressure-sensitive adhesive composition may be applied to encapsulate a top emission type organic electronic device while including no moisture absorbent to exhibit superior transparency; or may be applied to encapsulate a top emission type organic electronic device while including the moisture absorbent to exhibit superior water blocking properties, but the present application is not limited thereto. That is, the pressure-sensitive adhesive composition may be applied to encapsulate a bottom emission type organic electronic device while including no moisture absorbent to exhibit superior transparency.

For example, the moisture absorbent may be in a uniformly dispersed state in the pressure-sensitive adhesive composition or a pressure-sensitive adhesive film. Here, the uniformly dispersed state may refer to a state in which the moisture absorbent has the same or substantially same density in any part of the pressure-sensitive adhesive composition or a pressure-sensitive adhesive film. Examples of the moisture absorbent which may be used above may include a metal oxide, a sulfate, an organic metal oxide, etc. Specifically, examples of the sulfate may include magnesium sulfate, sodium sulfate, nickel sulfate, etc., and examples of the organic metal oxide may include aluminum oxide octylate, etc.

In the above description, specific examples of the metal oxide may include phosphorus pentoxide ($P_2O_5$), lithium oxide ($Li_2O$), sodium oxide ($Na_2O$), barium oxide (BaO), calcium oxide (CaO), or magnesium oxide (MgO). Examples of the metal salt may include sulfates such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), metal halides such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$), metal chlorates such as barium perchlorate ($Ba(ClO_4)_2$) or magnesium perchlorate ($Mg(ClO_4)_2$), and the like, but the present application is not limited thereto. As the moisture absorbent which may be included in the pressure-sensitive adhesive composition, one or at least two types of the above-described compositions may be used. In an example, when at least two types of the above-described compositions are used as the moisture absorbent, calcined dolomite or the like may be used.

The moisture absorbent may be controlled to have a suitable size depending on the purpose. In an example, the moisture absorbent may be controlled to have an average particle diameter of 100 to 15,000 nm. The moisture absorbent having a size in the above-described range is easy to store since a reaction rate with water is not too fast, an element to be encapsulated is not harmed, and water may be effectively removed.

A content of the moisture absorbent is not particularly limited, and may be suitably selected in consideration of desired blocking properties.

The pressure-sensitive adhesive composition may further include a water blocking agent as necessary. The term "water blocking agent" used herein may refer to a material which has little or no reactivity with water, but may block or inhibit the movement of water or moisture in the film. Examples of the water blocking agent may include one or at least two types of clay, talc, needle-shaped silica, planar silica, porous silica, zeolite, titanic, or zirconia. In addition, the water blocking agent may be surface-treated by an organic modifier to facilitate penetration of an organic material. The organic modifier may be, for example, dimethyl benzyl hydrogenated tallow quaternary ammonium, dimethyl dihydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof.

A content of the water blocking agent is not particularly limited, and may be suitably selected in consideration of desired blocking properties.

In addition to the above-described components, various additives may be included in the pressure-sensitive adhesive composition according to the usage and the manufacturing process of a pressure-sensitive adhesive film which will be described below. For example, the pressure-sensitive adhesive composition may include a curable material, a crosslinking agent, a filler or the like at a suitable content according to desired physical properties.

In a specific example of the present application, the pressure-sensitive adhesive film may be formed to have a single-layer structure including the pressure-sensitive adhesive layer, or may be formed as two or more layers as described below. For example, the pressure-sensitive adhesive film may include a first layer including the above-described pressure-sensitive adhesive and a second layer including a pressure-sensitive adhesive resin or adhesive resin. The pressure-sensitive adhesive resin or adhesive resin included in the second layer may be the same as the above-described polymer or not, and may be suitably selected by those skilled in the art according to the purpose. Further, the first layer and second layer each may include the moisture absorbent or not.

In an example, the adhesive resin included in the second layer is, for example, a resin which exhibits adhesive properties by curing, and may include a curable resin containing at least one heat-curable functional group such as a glycidyl group, an isocyanate group, a hydroxyl group, a carboxyl group, an amide group or the like, or at least one functional group that may be cured by irradiation of electromagnetic waves such as an epoxide group, a cyclic ether group, a sulfide group, an acetal group, a lactone group, etc. Further, specific examples of the above-described resin may include an acrylic resin, a polyester resin, an isocyanate resin, an epoxy resin or the like, but are not limited thereto.

In the present application, an aromatic or aliphatic epoxy resin; or an epoxy resin having a straight chain or branched chain may be used as the curable resin. In an example of the present application, the epoxy resin which has two or more functional groups and an epoxy equivalent in the range of 180 to 1,000 g/eq may be used. The characteristics such as the adhesive performance, glass transition temperature and the like of the cured material may be effectively maintained using the epoxy resin having the epoxy equivalent in the above-described range. An example of the epoxy resin as described above may include one type or a mixture of two or more types of a cresol novolac epoxy resin, a bisphenol A type epoxy resin, a bisphenol A type novolak epoxy resin, a phenol novolak epoxy resin, a 4-functional epoxy resin, a biphenyl type epoxy resin, a triphenol methane type epoxy resin, an alkyl-modified triphenol methane epoxy resin, a naphthalene type epoxy resin, a dicyclopentadiene type epoxy resin or a dicyclopentadiene-modified phenol type epoxy resin.

In a specific example of the present application, the first layer or second layer may include other compositions in addition to the above-described resin, for example, may include the above-described active energy ray-polymerizable compound, radical initiator, tackifier, water scavenger, water blocking agent, dispersant, silane compound or the like, and the compositions of the first layer and second layer may be identical to or different from each other. Moreover, the second layer may include a curable material, a cross-linking agent, a filler or the like at a suitable content according to desired physical properties.

The stacking order of the first layer and the second layer which is additionally stacked is not particularly limited. The second layer may be formed on the first layer, or vice versa. Further, the pressure-sensitive adhesive film may be formed as 3 or more layers, for example, the first layer may be included as two or more layers, or the second layer may be included as two or more layers.

In an example, the pressure-sensitive adhesive film may include a barrier film on one surface of the pressure-sensitive adhesive. The barrier film may be used without limitation insofar as the barrier film is formed of a material which is generally used in the related field. For example, the barrier film may include a base substrate layer, an organic undercoat layer, an inorganic vapor-deposited film, an organic top coat layer or the like, and the organic top coat layer may contact the pressure-sensitive adhesive.

Further, the pressure-sensitive adhesive film may have an excellent light transmittance in the visible light region. In an example, the pressure-sensitive adhesive film of the present application may exhibit light transmittance of 85% or more in the visible light region. For example, the pressure-sensitive adhesive film may have light transmittance of 85% or more, 87% or more, or 90% or more in the visible light region. Moreover, the pressure-sensitive adhesive film of the present application may exhibit a low haze in addition to superior light transmittance. In an example, the pressure-sensitive adhesive film may have a haze of 3% or less, 2% or less, 1% or less, 0.8% or less, 0.5% or less, or 0.3% or less.

In an example, the pressure-sensitive adhesive film may include a pressure-sensitive adhesive layer cross-linked by an irradiation source irradiating light in the wavelength range of 250 to 300 nm, in which light in the wavelength range of 250 to 300 nm accounts for 5 to 50%, 5 to 45% or 10 to 40% of the irradiated light. For example, the irradiation source may be a D-bulb (metal halide lamp) or a V-bulb (gallium lamp). Accordingly, the pressure-sensitive adhesive layer may be a pressure-sensitive adhesive layer cross-linked by a D-bulb or a V-bulb. In a specific example of the present application, the cross-linked structure and degree of crosslinking to be realized in the present application should be satisfied in order to satisfy the above-described physical properties of the expressions, and the cross-linked structure and degree of crosslinking may be affected by conditions of crosslinking. Therefore, it is preferable to exclude an irradiation source in which a short wavelength ratio is high.

The pressure-sensitive adhesive film may further include a substrate film or a release film (hereinafter, may be referred to as a "first film"), and may have a structure in which the pressure-sensitive adhesive is formed on the substrate film or release film. The structure may further include a substrate film or a release film (hereinafter, may be referred to as a "second film") formed on the pressure-sensitive adhesive.

FIGS. 1 and 2 are cross-sectional views of the exemplary pressure-sensitive adhesive films.

As shown in FIG. 1, the pressure-sensitive adhesive film 1 may include the pressure-sensitive adhesive 11 formed on the substrate or release film 12. As shown in FIG. 2, another exemplary pressure-sensitive adhesive film 2 may further include the substrate or release film 21 formed on the pressure-sensitive adhesive 11. Although not shown in the drawings, the pressure-sensitive adhesive film may only include the pressure-sensitive adhesive composition without a supporting substrate such as the substrate or release film to have a structure of only including the pressure-sensitive adhesive composition in the film or sheet form which remains solid or semi-solid at room temperature, or the pressure-sensitive adhesive film may have a structure in which the pressure-sensitive adhesive composition is formed on both surfaces of one substrate or release film.

A specific type of the first film is not particularly limited. As the first film, for example, a plastic film may be used. Examples of the first film may include a polyethylene terephthalate film, a polyethylene fluoroethylene film, a polyethylene film, a polypropylene film, a polybutene film, a polybutadiene film, a vinyl-chloride copolymer film, a polyurethane film, an ethylene-vinyl acetate film, an ethylene-propylene copolymer film, an ethylene-ethyl acrylate copolymer film, an ethylene-methyl acrylate copolymer film, a polyimide film, etc.

When the first film is a release film, the release film may be used by performing a suitable release treatment on one or both surfaces of the plastic film as described above. Examples of release agents may include an alkyd-based release agent, a silicone-based release agent, a fluorine-based release agent, an unsaturated ester-based release agent, a polyolefin-based release agent, a wax-based release agent, etc. The alkyd-based release agent, silicone-based release agent or fluorine-based release agent may be generally used among the release agents in consideration of thermal resistance or the like, but the present application is not limited thereto.

As the first film, for example, a plastic film in which a gas barrier film is formed on the surface or side of a substrate may be used. For example, this film may directly form a substrate of an organic electronic device to be used for realizing a flexible element.

A specific type of the second film is also not particularly limited. For example, within the range of the above-described examples of the first film, the film of the same type as the first film or a different type may be used as the second film.

The thickness of the first or second film is not particularly limited. In an example, the thickness of the first film may be in the range of about 50 to 500 µm, or 100 to 200 µm. When the thickness of the first film is in the above-described range, the manufacturing process of the organic electronic device may be effectively automated, and is also advantageous in terms of economic efficiency.

The thickness of the second film is also not particularly limited. For example, the thickness of the second film may be adjusted to be the same as that of the first film, or relatively thinner or thicker than that of the first film.

The pressure-sensitive adhesive of the pressure-sensitive adhesive film includes the pressure-sensitive adhesive composition, and has a film or sheet form. The pressure-sensitive adhesive composition may be cross-linked or non-cross-linked in the pressure-sensitive adhesive. The pressure-sensitive adhesive may be in a solid or semi-solid state at room temperature. The pressure-sensitive adhesive resin may form a cross-linked structure in the encapsulation structure of the organic electronic device.

The thickness of the pressure-sensitive adhesive is not particularly limited, and may be suitably selected in consideration of the purpose. For example, the pressure-sensitive adhesive may have a thickness in the range of about 5 to 200 µm. For example, the thickness of the pressure-sensitive adhesive may be adjusted in consideration of an embedding property when used as an encapsulant of the organic electronic device, processability, economical efficiency, etc.

The present application also relates to a method of manufacturing the pressure-sensitive adhesive film. An exemplary pressure-sensitive adhesive film may include the pressure-sensitive adhesive composition formed as a film or sheet.

In an example, the method may include applying a coating solution including the pressure-sensitive adhesive composition on a substrate or release film to form a sheet or film shape, and drying the applied coating solution. The manufacturing method may include attaching an additional substrate or release film to the dried coating solution.

For example, the coating solution including the pressure-sensitive adhesive composition may be prepared by dissolving or dispersing each component of the above-described pressure-sensitive adhesive composition in a suitable solvent. In an example, the pressure-sensitive adhesive composition may be prepared in a manner in which the moisture absorbent, water blocking agent or filler is dissolved or dispersed in a solvent, milled, and the milled moisture absorbent, water blocking agent or filler is mixed with the polymer as necessary.

The type of the solvent used to prepare a coating solution is not particularly limited. However, when the drying time of a solvent is significantly extended, or drying at a high temperature is needed, there may be a problem in terms of workability or durability of a pressure-sensitive adhesive film, and thus a solvent having a volatilization temperature of 150° C. or less may be used. A small amount of a solvent having a volatilization temperature over the above-described range may be further mixed to the solvent in consideration of film formability, etc. An example of the solvent may include one or two or more of methyl ethyl ketone (MEK), acetone, toluene, dimethylformamide (DMF), methyl cellosolve (MCS), tetrahydrofuran (THF), xylene, N-methylpyrrolidone (NMP), or the like, but is not limited thereto.

A method of applying the coating solution on the substrate or release film is not particularly limited, and for example, a well-known coating method such as a knife-coating method, a roll-coating method, a spray-coating method, a gravure-coating method, a curtain-coating method, a comma-coating method, a lip-coating method, or the like may be used.

The applied coating solution is dried to evaporate the solvent, and thereby the pressure-sensitive adhesive may be formed. For example, the drying of the coating solution may be performed at 70 to 150° C., more than 100° C., less than 150° C., 105 to 150° C., 110 to 150° C., or 120 to 140° C. for 1 to 10 minutes. The conditions of the drying of the coating solution may be changed in consideration of the type of the solvent used. Desired physical properties such as the degree of crosslinking or the like in the present application may be realized with the drying conditions. The drying may be followed by formation of an additional substrate or release film on the pressure-sensitive adhesive, and thereafter, crosslinking the pressure-sensitive adhesive may be further included. The crosslinking may be UV crosslinking which is performed by UV light at an intensity of 0.2 to 5 $J/cm^2$, 0.2 to 3 $J/cm^2$, 0.5 to 1.8 $J/cm^2$ or 0.8 to 1.5 $J/cm^2$. The UV crosslinking may be performed by light irradiation using a D-bulb (metal halide lamp or a V-bulb (gallium lamp)). When light is radiated using the aforementioned lamp, the cross-linked structure and degree of crosslinking to be realized in the present application may be satisfied. For example, in the case of an H-bulb (mercury lamp), the lamp has too high of a short wavelength ratio to realize a desired degree of crosslinking in the present application.

As described above, it is required to realize a specific cross-linked structure such that the pressure-sensitive adhesive film of the present application satisfies a complex modulus value according to Expression 4 and exhibits the effect desired in the present application, and the formation of the cross-linked structure may be affected by the conditions of drying or crosslinking in addition to the above-described compositions. Accordingly, when the conditions of drying or crosslinking of the pressure-sensitive adhesive film are adjusted as described above, the degree of crosslinking in a suitable range may be realized, and thus reliable pressure-sensitive adhesive film may be provided.

The present application also relates to an organic electronic device. The organic electronic device may include a substrate; an organic electronic element formed on the substrate; and a pressure-sensitive adhesive film encapsulating the entire surface, for example, both the top surface and side surface of the organic electronic element. The pressure-sensitive adhesive film may include the pressure-sensitive adhesive containing the pressure-sensitive adhesive composition in a cross-linked state. A product of encapsulating the organic electronic device may further include a cover substrate formed on the top of the pressure-sensitive adhesive.

In the above description, the organic electronic element may be, for example, an organic light-emitting element.

Further, the present application also relates to a method of manufacturing the organic electronic device. For example, a product of encapsulating the organic electronic device may be manufactured using the pressure-sensitive adhesive film.

The pressure-sensitive adhesive may be formed as an encapsulation layer for a structure to effectively fix and support the substrate and cover substrate, which exhibits excellent water blocking properties and optical properties in the organic electronic device.

Further, the pressure-sensitive adhesive has high transparency, and thus may be formed as a stable pressure-sensitive adhesive regardless of the types of the organic electronic device such as a top emission type, a bottom emission type, etc.

The term "encapsulation layer" used herein may refer to a pressure-sensitive adhesive which covers both the top surface and side surface of the organic electronic element.

FIG. 3 is a schematic view illustrating an exemplary organic electronic device in a case in which an organic electronic element is an organic light-emitting element.

A method of manufacturing the organic electronic device may include: applying the above-described pressure-sensitive adhesive film on a substrate on which an organic electronic element is formed, such that the pressure-sensitive adhesive film covers the organic electronic element; and curing the pres sure-sensitive adhesive film.

The term "curing" used herein may refer to foming a cross-linked structure of the pressure-sensitive adhesive composition of the present application by a heat process, a UV irradiation process or the like to form the shape of a pressure-sensitive adhesive.

Specifically, a transparent electrode may be formed on glass or the polymer film 31 used as a substrate using a method such as vacuum deposition or sputtering, and a light emitting organic material layer constituting of, for example, a hole transport layer, a light emitting layer, an electron transport layer or the like may be formed on the transparent electrode, and then an electrode layer may be further formed thereon to form the organic electronic element 32. Subsequently, the pressure-sensitive adhesive of the pressure-sensitive adhesive film is positioned to cover the entire surface of the organic electronic element 32 of the substrate 31 passing through the above-described process.

Thereafter, the pressure-sensitive adhesive may be compressed on the organic electronic element while being heated using a laminating machine or the like to have liquidity, and a resin in the pressure-sensitive adhesive may be cross-linked to form an encapsulation layer.

In an example, the pressure-sensitive adhesive 33 positioned to cover the entire surface of the organic electronic element 32 may be in a state of being previously transferred onto the cover substrate 34 such as glass or the polymer film. For example, the pressure-sensitive adhesive may be transferred onto the cover substrate 34 by applying heat using a vacuum press or vacuum laminator in a state in which pressure-sensitive adhesive contacts the cover substrate 34, after the first or second film is peeled off from the pressure-sensitive adhesive film. When the pressure-sensitive adhesive includes a curable pressure-sensitive adhesive resin which is heat-curable, an excessive curing reaction occurs in the above-described process, and an adhesive force or pressure-sensitive adhesive force of the encapsulation layer may be reduced. Therefore, a process temperature may be adjusted to about 100° C. or less, and a process time may be adjusted to be within 5 minutes.

The encapsulation layer may be formed by positioning the cover substrate 34 onto which the pressure-sensitive adhesive is transferred, and performing the hot-pressing process thereon.

The encapsulation layer may be formed by curing the pressure-sensitive adhesive 33. The terms "encapsulation layer" and "pressure-sensitive adhesive layer" used in the present specification may have the same meaning. For example, a curing process may be performed in a suitable heating chamber or ultraviolet ray chamber according to a curing method of the curable pressure-sensitive adhesive resin. The heating conditions or the conditions of irradiating active energy rays may be suitably selected in consideration of stability of the organic electronic element, a curing property of the pressure-sensitive adhesive resin, or the like. Further, an autoclave for applying heat and pressure may be used to increase the compression efficiency.

In the above description, one example of the method of manufacturing the organic electronic device was described, but the organic electronic device may be manufactured using other methods. For example, the sequence, conditions or the like of the process may be changed while the device is manufactured in the same manner as described above. For example, the pressure-sensitive adhesive is first transferred onto the organic electronic element on the substrate 31 instead of being previously transferred onto the cover substrate 34, and then a curing process is performed in a state in which the cover substrate 34 is laminated thereon to form the encapsulation layer.

Effects

The pressure-sensitive adhesive film of the present application can be applied for sealing or encapsulating the entire surface of an organic electronic device such as an OLED, etc. The pressure-sensitive adhesive film of the present application can form an excellent sealing or encapsulation structure which has no air bubbles under high temperature and high humidity conditions, when applied in the sealing or encapsulation process as described above. The pressure-sensitive adhesive film can form a structure effectively blocking water or oxygen from penetrating into the organic electronic device from the outside, and has excellent mechanical properties such as handleability, formability or the like and transparency. The pressure-sensitive adhesive film can be, for example, applied for sealing or encapsulating an OLED having a top emission structure.

DETAILED DESCRIPTION OF EXEMPLARY EMBODIMENTS

Figure 1:
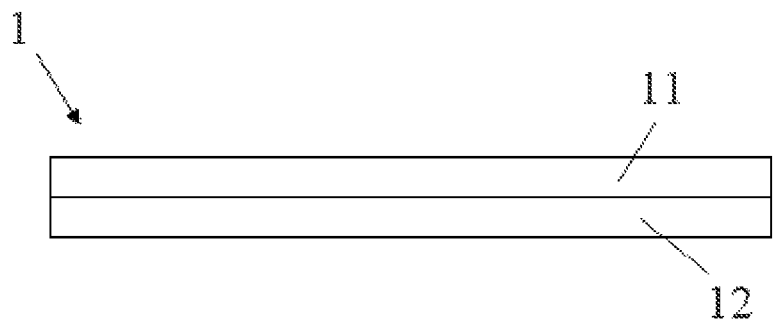
FIGS. 1 and 2 are cross-sectional views of a pressure-sensitive adhesive film according to an example of the present application.
Figure 2:
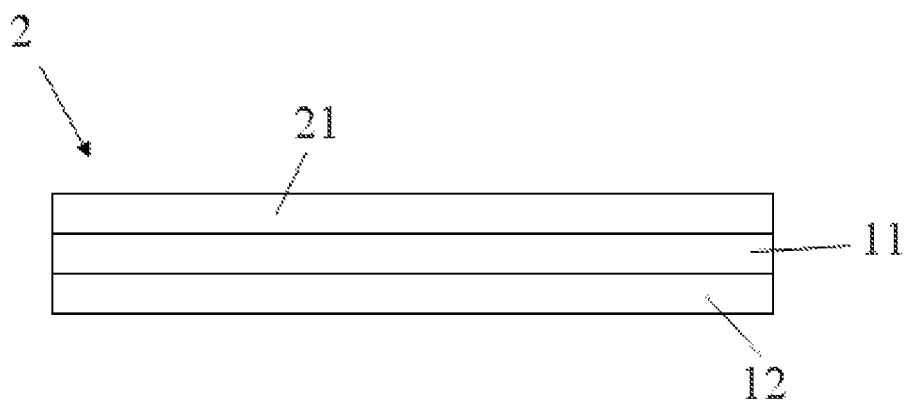
Figure 3:
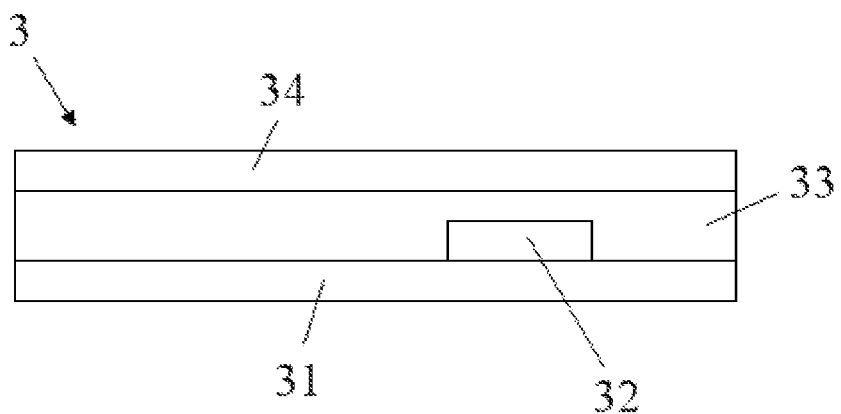
FIG. 3 is a cross-sectional view of an organic electronic device-encapsulation product according to an example of the present application.

Hereinafter, the present application will be described in detail with reference to examples according to the present application and comparative examples not according to the present application, but the scope of the present application is not limited to the following examples.

Example 1

80 g of butyl rubber (BUTYL 301 manufactured by Lanxess AG) as a polymer, 20 g of a hydrogenated DCPD-based tackifier resin (SU-90 manufactured by Kolon Industries, Inc.) as a tackifier, 10 g of tricyclodecane dimethanol diacrylate (M262 manufactured by Miwon Specialty Chemicals Co., Ltd.) as an active energy ray-polymerizable compound, and 1 g of 2,2-dimethoxy-1,2-diphenylethane-1-one (Irgacure 651 manufactured by Ciba Specialty Chemicals) as a radical initiator were introduced, and diluted with toluene such that the solid content is 15 wt %, and thereby an a coating solution was prepared.

The prepared solution was applied onto a release surface of a release PET film, dried in an oven at 120° C. for 15 minutes, and thereby a pressure-sensitive adhesive film including a pressure-sensitive adhesive layer with a thickness of 20 μm was prepared. The physical properties of a sample prepared by irradiating UV light at intensity of 1 J/cm² to the prepared film using a D-bulb were measured.

Comparative Example 1

A pressure-sensitive adhesive film was prepared in the same manner as in Example 1 except that a sample was prepared by irradiating UV light at intensity of 0.1 J/cm² to the prepared film using an H-bulb.

The physical properties in the example and comparative example were measured according to the following methods.

1. Evaluation of Reliability

The films prepared in the example and comparative example were laminated on a barrier film (serving as a cover substrate), laminated on a glass substrate, and pressed with pressure and heat at 5 atm and 80° C. on a substrate to prepare a specimen. Thereafter, the specimen was examined to determine whether or not lifting, an air bubble or haze was generated between the glass substrate and the pressure-sensitive adhesive layer in a constant temperature and constant humidity chamber under conditions of 85° C. and relative humidity of 85% for about 500 hours. When the specimen was observed with the naked eye, the case in which any one of lifting, the air bubble or haze was generated between the glass substrate and the pressure-sensitive adhesive layer was represented by "X", and the case in which none of lifting, the air bubble or haze was generated was represented by "O".

2. Measurement of Phase Angle

The storage modulus G' and loss modulus G" of circular samples (diameter: 8 mm, thickness: 500 μm) prepared using the pressure-sensitive adhesive layers of the example and comparative example were measured using a discovery hybrid rheometer (DHR2) manufactured by TA Instrument Inc. under conditions of a temperature of 80° C. and a strain of 1% (strain in the linear region) while a frequency was increased from 0.01 to 100 Hz. A phase angle when a frequency was 0.1 Hz was measured using the following Expression 1.

$$\delta = \tan^{-1}(G''/G') \quad \text{[Expression 1]}$$

3. Measurement of Complex Modulus

The storage modulus and loss modulus were measured in the same manner as the method of measurement of the phase angle, and a complex modulus was calculated according to the following Expression 6.

$$|G^*| = \sqrt{(G')^2 + (G'')^2} \quad \text{[Expression 6]}$$

4. Measurement of Plateau Modulus

The storage modulus and loss modulus were measured according to the change in frequency while a frequency was increased from 0.01 to 100 Hz as in the measurement of the phase angle, and a phase angle and complex modulus were calculated according to Expressions 1 and 6 from the measured storage modulus and loss modulus.

The values of the phase angle and complex modulus in the frequency range of 0.01 to 100 Hz were plotted as a graph of the phase angle (Y-axis) with respect to the complex modulus (X-axis). In the plotted graph, the complex modulus at the minimum phase angle, that is, $G_N^0$ (plateau modulus) was measured.

TABLE 1

| | Phase angle ° | Plateau modulus Pa | Reliability at high temperature and humidity 85° C., 85% RH |
|---|---|---|---|
| Example 1 | 12.61 | 314,045 | O |
| Comparative Example 1 | 9.48 | 168,142 | X |

DESCRIPTION OF REFERENCE NUMERALS

1, 2: pressure-sensitive adhesive film
11: pressure-sensitive adhesive layer
12: first film
21: second film
3: organic electronic device
31: substrate
32: organic electronic element
33: pressure-sensitive adhesive layer or encapsulation layer
34: cover substrate

What is claimed is:

1. A pressure-sensitive adhesive film, comprising a pressure-sensitive adhesive layer which comprises a polymer derived from isobutylene and satisfies the following Expression 4:

$$2.0 \times 10^5 \text{ Pa} \leq G_N^0 \leq 5.0 \times 10^5 \text{ Pa} \quad \text{[Expression 4]}$$

where, in Expression 4, $G_N^0$ is a complex modulus value when a phase angle is a minimum in a graph (X-axis: complex modulus, Y-axis: phase angle) of a phase angle and complex modulus of a circular sample (diameter: 8 mm, thickness: 500 μm) prepared using the pressure-sensitive adhesive layer, which are measured using a discovery hybrid rheometer (DHR) while a frequency range is increased from 0.01 to 100 Hz at a temperature of 80° C. and a strain of 1%.

2. The pressure-sensitive adhesive film of claim 1, wherein the pressure-sensitive adhesive layer has a recovery rate $R_1$ of 55% or more according to the following Expression 3:

$$R_1 = (S_M - S_{R,30}) \times 100 / S_M \quad \text{[Expression 3]}$$

where, in Expression 3, $S_M$ is a maximum strain (%) of the circular sample (diameter: 8 mm, thickness: 500 μm) prepared using the pressure-sensitive adhesive layer, which is measured using a discovery hybrid rheometer (DHR) when a strain is applied at a shear stress of 2,000 Pa and a temperature of 80° C. for 3 minutes, and $S_{R,30}$ is a residual strain (%) measured 30 seconds after the stress is removed.

3. The pressure-sensitive adhesive film of claim 1, wherein the pressure-sensitive adhesive layer has a phase angle (δ) in a range of 10° to 18° according to the following Expression 1:

$$\delta = \tan^{-1}(G''/G') \quad \text{[Expression 1]}$$

where, in Expression 1, G' and G" respectively represent a storage modulus G' and loss modulus G" of the circular sample (diameter: 8 mm, thickness: 500 μm) prepared using the pressure-sensitive adhesive layer, which are measured using a discovery hybrid rheometer (DHR) under conditions of a temperature of 80° C., a strain of 1% and a frequency of 0.1 Hz.

4. The pressure-sensitive adhesive film of claim 1, wherein the pressure-sensitive adhesive layer has a complex viscosity ($\eta^* = |G^*|/\omega$) of $2.5 \times 10^4$ Pa·s to $5.0 \times 10^4$ Pa·s according to the following Expression 2:

$$\eta^* = |G^*|/\omega = \sqrt{(G'/\omega)^2 + (G''/\omega)^2} \quad \text{[Expression 2]}$$

where, in Expression 2, ω represents a frequency and is 6.28 rad/s, and G' and G" respectively represent a storage modulus G' and loss modulus G" of the circular sample (diameter: 8 mm, thickness: 500 μm) prepared using the pressure-sensitive adhesive layer, which are measured using a discovery hybrid rheometer (DHR) under conditions of a temperature of 80° C., a strain of 1% and a frequency of 0.1 Hz.

5. The pressure-sensitive adhesive film of claim 1, wherein the pressure-sensitive adhesive layer further comprises an active energy ray-polymerizable compound which is polyfunctional.

6. The pressure-sensitive adhesive film of claim 1, wherein the polymer derived from isobutylene is a copolymer of a diene and an olefin-based compound comprising one carbon-carbon double bond.

7. The pressure-sensitive adhesive film of claim 1, wherein the polymer derived from isobutylene comprises a copolymer having a polymerization unit of the following Formula A and a polymerization unit of the following Formula B:

[Formula A]

[Formula B]

8. The pressure-sensitive adhesive film of claim 7, wherein the copolymer comprises the polymerization unit of Formula A at 95 to 99.5 mol % and the polymerization unit of Formula B at 0.5 to 5 mol %.

9. The pressure-sensitive adhesive film of claim 5, wherein the active energy ray-polymerizable compound which is polyfunctional satisfies the following Formula 1:

[Formula 1]

where, in Formula 1, $R_1$ is hydrogen or an alkyl group having 1 to 4 carbon atoms, n is an integer of 2 or more, X represents an n-valent residue derived from a linear, branched or cyclic alkyl group having 3 to 30 carbon atoms.

10. The pressure-sensitive adhesive film of claim 5, wherein the active energy ray-polymerizable compound is included at 5 to 30 parts by weight relative to 100 parts by weight of the polymer.

11. The pressure-sensitive adhesive film of claim 1, wherein the pressure-sensitive adhesive layer further comprises a tackifier.

12. The pressure-sensitive adhesive film of claim 11, wherein the tackifier is a hydrogenated cyclic olefin-based polymer.

13. The pressure-sensitive adhesive film of claim 5, wherein the pressure-sensitive adhesive layer further comprises a radical initiator.

14. The pressure-sensitive adhesive film of claim 13, wherein the radical initiator is included at 0.2 to 20 parts by weight relative to 100 parts by weight of the active energy ray-polymerizable compound.

15. The pressure-sensitive adhesive film of claim 1, wherein the pressure-sensitive adhesive layer further comprises a moisture absorbent.

16. The pressure-sensitive adhesive film of claim 1, which has a light transmittance of 85% or more in a visible light region.

17. The pressure-sensitive adhesive film of claim 1, which has a haze of 3% or less.

18. An organic electronic device, comprising:
a substrate;
an organic electronic element formed on the substrate; and
the pressure-sensitive adhesive film according to claim 1 which encapsulates the organic electronic element.

19. A method of manufacturing an organic electronic device, comprising:
applying the pressure-sensitive adhesive film according to claim 1 on a substrate on which an organic electronic element is formed, such that the pressure-sensitive adhesive film covers the organic electronic element; and
crosslinking the pressure-sensitive adhesive film.

* * * * *